United States Patent
Byun et al.

(10) Patent No.: US 7,624,317 B2
(45) Date of Patent: Nov. 24, 2009

(54) PARALLEL BIT TEST CIRCUIT AND METHOD FOR SEMICONDUCTOR MEMORY DEVICE

(75) Inventors: Sang-Man Byun, Suwon-si (KR); Sang-Seok Kang, Suwon-si (KR)

(73) Assignee: Samsung Electronics, Co., Ltd., Suwon-si, Gyeonggi-do (KR)

( * ) Notice: Subject to any disclaimer, the term of this patent is extended or adjusted under 35 U.S.C. 154(b) by 323 days.

(21) Appl. No.: 11/709,689

(22) Filed: Feb. 23, 2007

(65) Prior Publication Data

US 2007/0288812 A1 Dec. 13, 2007

(30) Foreign Application Priority Data

Jun. 8, 2006 (KR) ........................ 10-2006-0051618

(51) Int. Cl.
*G11C 29/00* (2006.01)
(52) U.S. Cl. .................. 714/719; 714/5; 714/25; 714/42; 714/718; 714/720; 714/736; 365/201
(58) Field of Classification Search .................. None
See application file for complete search history.

(56) References Cited

U.S. PATENT DOCUMENTS

| | | | | |
|---|---|---|---|---|
| 5,077,689 A | * | 12/1991 | Ahn | 365/201 |
| 5,305,266 A | * | 4/1994 | Rountree | 365/201 |
| 5,416,741 A | * | 5/1995 | Ohsawa | 365/201 |
| 5,436,910 A | * | 7/1995 | Takeshima et al. | 714/718 |
| 5,777,932 A | * | 7/1998 | Chonan | 365/201 |
| 6,154,860 A | * | 11/2000 | Wright et al. | 714/718 |
| 6,400,623 B2 | * | 6/2002 | Ohno | 365/201 |
| 6,442,717 B1 | * | 8/2002 | Kim | 714/719 |
| 6,583,597 B2 | * | 6/2003 | Tanaka et al. | 318/687 |
| 6,636,998 B1 | * | 10/2003 | Lee et al. | 714/735 |
| 2005/0289412 A1 | | 12/2005 | Kim et al. | |

FOREIGN PATENT DOCUMENTS

| | | |
|---|---|---|
| JP | 05-020899 | 1/1993 |
| KR | 1998013998 A | 5/1998 |
| KR | 1020040104792 A | 12/2004 |
| KR | 100535251 B1 | 12/2005 |

* cited by examiner

*Primary Examiner*—John P Trimmings
(74) *Attorney, Agent, or Firm*—Volentine & Whitt, PLLC

(57) ABSTRACT

A semiconductor memory device performs a parallel bit test on a plurality of memory blocks by writing test pattern data into the plurality of memory blocks, outputting two bits from each memory block in parallel and comparing the two bits output from each memory block with each other in a first test mode, and outputting two bits from respectively different memory blocks and comparing the two bits output from the respectively different memory blocks with each other in a second test mode.

14 Claims, 6 Drawing Sheets

Mode2                                    Mode1

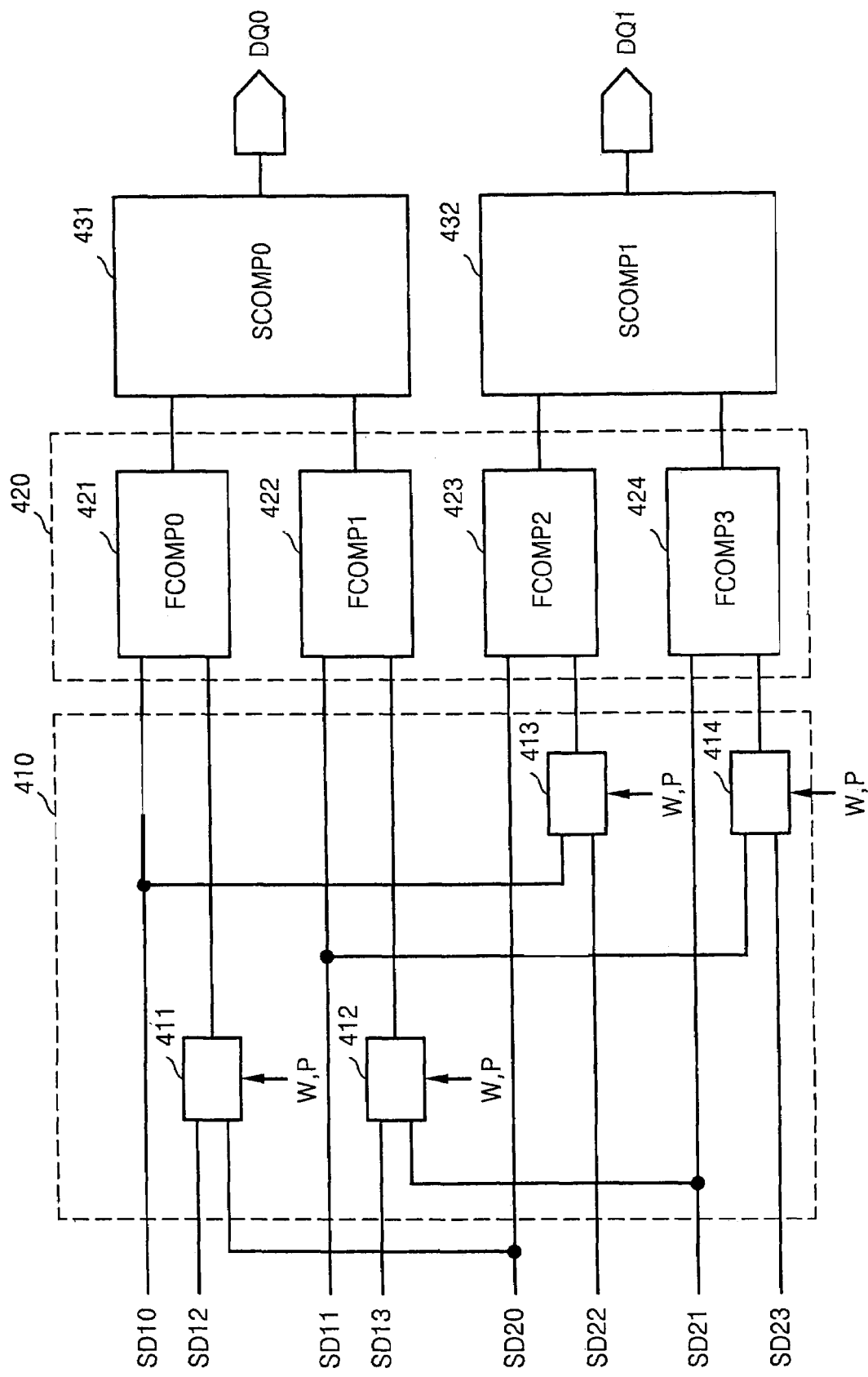

PARALLEL BIT TEST CIRCUIT AND METHOD FOR SEMICONDUCTOR MEMORY DEVICE

BACKGROUND OF THE INVENTION

1. Field of the Invention

Embodiments of the present invention relate generally to semiconductor memory devices. More particularly, embodiments of the invention relate to parallel bit test (PBT) circuits and methods of testing memory cells in semiconductor memory devices using the PBT circuits.

A claim of priority is made to Korean Patent Application No. 10-2006-51618, filed on Jun. 8, 2006, the disclosure of which is hereby incorporated by reference in its entirety.

2. Description of Related Art

Semiconductor memory devices are typically manufactured by performing several design and processing steps on a semiconductor wafer. Following manufacture, the semiconductor memory devices are then tested for defects. This testing often occurs both after performing the processing steps on the semiconductor wafer and after the semiconductor memory devices are packaged. The testing performed after processing the wafer is commonly referred to as a wafer test, and the testing performed after packaging the devices is commonly referred to as a package test.

In general, semiconductor memory devices include a huge number of memory cells. When testing semiconductor memory devices, preferably each of the memory cells is tested for defects. In practice, it is very difficult to manufacture a semiconductor memory device without any defects at all. Accordingly, to address this problem, semiconductor devices often include redundant memory cells adapted to function in place of defective memory cells. However, in order for the redundant memory cells to function in place of the defective memory cells, the defective memory cells must typically be identified so that a compensation or repair function can be performed to establish the redundant memory cells to function in place of the defective cells.

One way to identify defective memory cells in a semiconductor memory device is through a parallel bit test. A parallel bit test (PBT) is generally performed by a PBT circuit in the semiconductor memory device under the control of a test apparatus. The test apparatus sends a command to the semiconductor memory to establish a test mode for the PBT. Two common test modes include a wafer test mode for performing a wafer test and a package test mode for performing a package test.

Once the test mode is established, the test apparatus sends write commands to the semiconductor memory device to write a test data pattern to memory cells in the semiconductor memory device. Once the test data pattern is written in the memory cells, the test apparatus sends read commands to the semiconductor device to cause the PBT circuit to test whether the test data pattern was properly written in the memory cells. The PBT circuit tests whether the test data pattern was properly written in the memory cells by examining pairs of memory cells that are supposed to store the same data based on the test data pattern. In other words, the PBT circuit compares data stored in pairs of memory cells and where the same data is stored in both memory cells of the pair, the memory cells are considered to be functioning correctly. On the other hand, where different data is stored in both memory cells of the pair, one or more memory cells in the pair are determined to be defective.

As an example, FIG. 1 is a conceptual diagram illustrating a conventional parallel bit test method for a semiconductor memory device. Referring to FIG. 1, the semiconductor memory device comprises first through fourth memory blocks 10, 11, 12, and 13. Each of memory blocks 10, 11, 12, and 13 comprises four input-output (IO) lines adapted to input or output four bits at a time. In a PBT test mode, 4 bits of parallel data output from each of memory blocks 10, 11, 12, and 13 are divided into pairs and the bits in each pair are compared with each other.

The parallel bit test method will be described in more particular detail with reference to memory block 10 in FIG. 1. The method performed in relation to memory block 10 is similar to the method performed in relation to memory blocks 11 through 13 and therefore, detailed descriptions of the operation of memory blocks 11 through 13 is omitted to avoid redundancy.

Memory block 10 stores bits D10 through D13. In the PBT test mode, bits D10 and D12 are compared with each other in a first primary comparison and bits D11 and D13 are compared with each other in a second primary comparison. After the first and second primary comparisons are performed, results of the first and second primary comparison are combined in a secondary comparison to produce an output signal on an IO pin DQ0. The first and second primary comparisons are typically performed by performing an XOR operation on two bits. The secondary comparison is then performed by performing an OR operation on results of the respective first and second primary comparisons. Accordingly, where the two bits in the first primary comparison are the same, the XOR operation of the first primary comparison will result in an output of a logical "0". Similarly, where the two bits in the second primary comparison are the same, the XOR operation of the second primary comparison will result in an output of logical "0". Where both the first and second primary comparisons result in an output of logical "0", the OR operation of the secondary comparison will result in a logical "0", indicating a successful parallel bit test. However, if any pair of bits are different in the first or second primary comparisons, the XOR operation of the first or second primary comparison will result in an output of logical "1" on IO pin DQ0, and therefore, the OR operation of the secondary comparison will result in an output of logical "1" on IO pin DQ0, indicating a failed parallel bit test.

Unfortunately, all pairwise bit comparisons in the method illustrated in FIG. 1 take place between bits in the same memory block. However, defective memory cells in the same memory block may be correlated, and therefore even if the parallel bit test indicates that both memory cells in a pair store the same data, it is likely that both memory cells in a pair are defective and that the parallel bit test will fail to identify those defective memory cells. In addition, the bit comparisons are fixed so that only a limited number of test patterns can be used to test whether the memory cells are functioning correctly. For example, the only test patterns that can be used to test memory cells in memory block 10 are "0000", "1010", "0101", and "1111". This limited number of test patterns can also prevent defective memory cells from being discovered. As a result, it is difficult for the conventional method parallel bit test method to detect all of the defective memory cells in a semiconductor memory device.

SUMMARY OF THE INVENTION

Embodiments of the invention provide a parallel bit test circuit and associated methods adapted to eliminate a limit in a range of test data patterns that can be used to test a semiconductor memory device for defective cells.

According to one embodiment of the invention, a parallel bit test circuit for a semiconductor memory device including a plurality of memory blocks is provided. The parallel bit test circuit comprises a plurality of primary comparators each adapted to receive and compare two bits of data output in parallel from a corresponding one of the plurality of memory blocks in a first test mode to produce primary comparison output data, and further adapted to receive and compare two bits of data output by two respectively different memory blocks among the plurality of memory blocks in a second test mode to produce primary comparison output data. The parallel bit test circuit further comprises a secondary comparator adapted to combine at least two bits of primary comparison output data produced by the primary comparators to produce secondary comparison output data.

According to another embodiment of the invention, a parallel bit test method for a semiconductor memory device including a plurality of memory blocks is provided. The method comprises writing test pattern data into the plurality of memory blocks, outputting two bits from each memory block in parallel and comparing the two bits output from each memory block with each other in a first test mode, and outputting two bits from respectively different memory blocks and comparing the two bits output from the respectively different memory blocks with each other in a second test mode.

According to still another embodiment of the invention, a semiconductor memory device is provided. The semiconductor memory device comprises a plurality of memory blocks, a plurality of primary comparators each adapted to receive and compare two bits of data output in parallel from each memory block in a first test mode and further adapted to receive and compare two bits of data output from respectively different memory blocks in a second test mode, and a secondary comparator adapted to generate test result data by combining at least two signals among signals output from the respective plurality of primary comparators.

BRIEF DESCRIPTION OF THE DRAWINGS

Embodiments of the invention are described in relation to the accompanying drawings. Throughout the drawings like reference numbers indicate like exemplary elements, components, and steps. In the drawings:

FIG. 4 is a circuit diagram of a parallel bit test circuit according to an embodiment of the present invention.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims.

Figure 2:
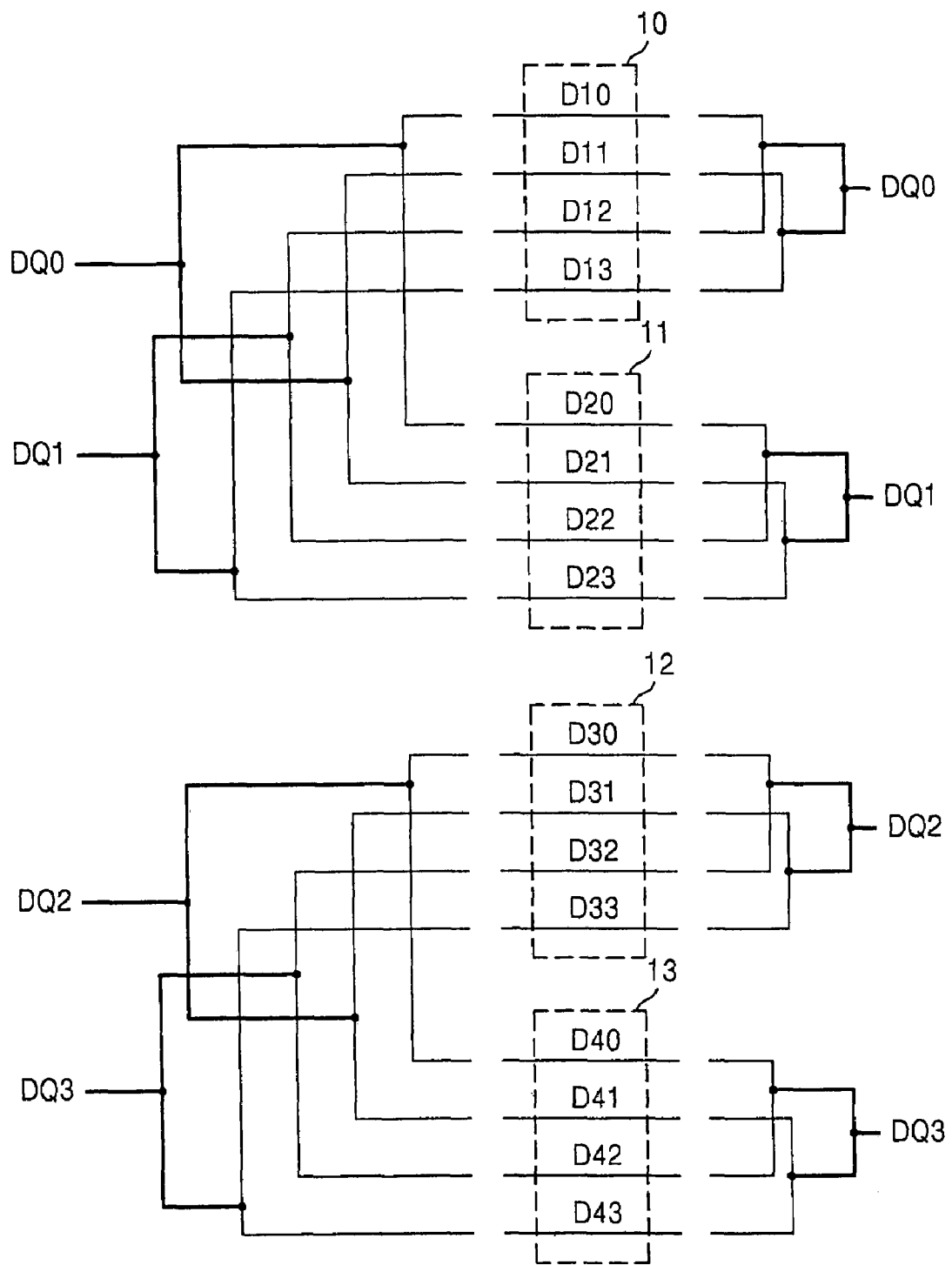
FIG. 2 is a conceptual diagram illustrating a parallel bit test method for a semiconductor memory device according to an embodiment of the present invention.

FIG. 2 is a conceptual diagram illustrating a parallel bit test method for a semiconductor memory device according to an embodiment of the present invention. Referring to FIG. 2, the parallel bit test method can be performed in two different modes, both of which are parallel bit test (PBT) modes. In a first test mode Mode1, also referred to as a wafer test mode, the method is performed in a wafer stage before repairs are performed on the semiconductor memory device. In a second test mode Mode2, also referred to as a package test mode, the method is performed in a package stage after the repairs have been performed on the semiconductor memory device.

Figure 1:
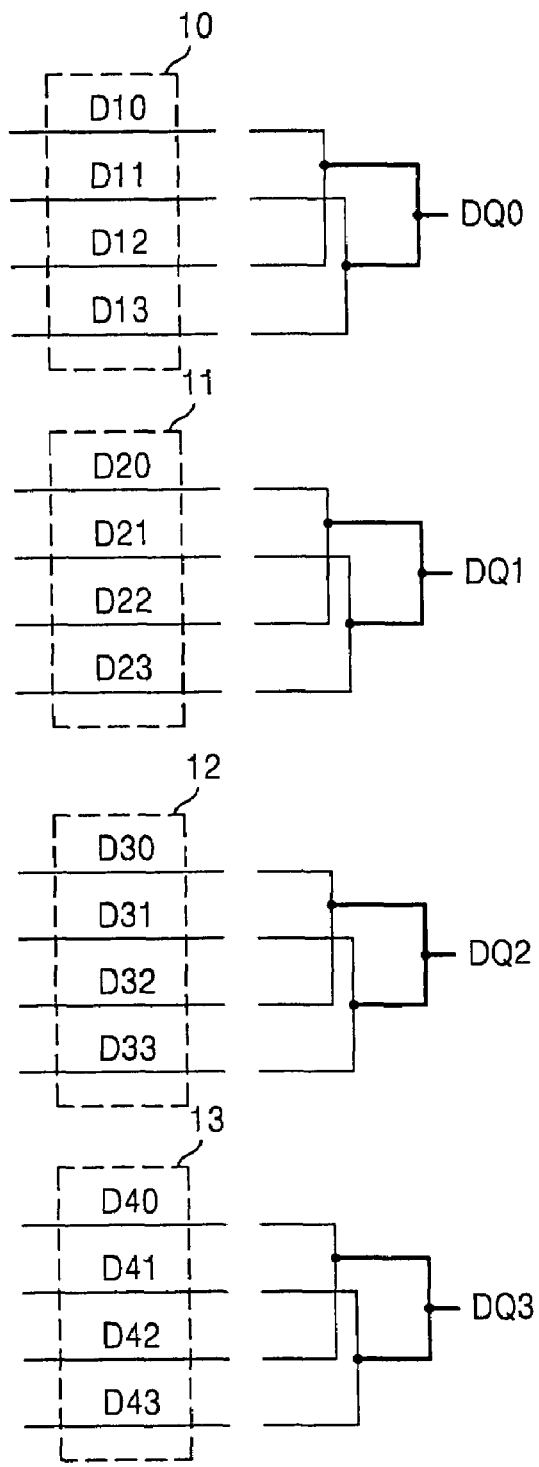
FIG. 1 is a conceptual diagram illustrating a conventional parallel bit test method for a semiconductor memory device.

The parallel bit test method performed in first test mode Mode1 is similar to the conventional parallel bit test method of FIG. 1 in that, in first test mode Mode1, 4 bits in each of first through fourth memory blocks 10, 11, 12, and 13, are divided into pairs and intra-pair comparisons are made as primary comparisons. After the primary comparisons, results of the intra-pair comparisons are combined in secondary comparisons. As an example, bits D10, D11, D12, and D13 in first memory block 10 are divided into first and second pairs comprising bits D10 and D12 and bits D11 and D13, respectively, and the bits within each of the first and second pairs are compared to each other in primary comparisons. After the primary comparisons, results of the primary comparisons are combined in a secondary comparison. A result of the secondary comparison in first memory block 10 is output on a corresponding data input/output (IO) pin DQ0.

In second test mode Mode2, data output from different memory blocks is compared. For example, bit D10 output from first memory block 10 is compared with a bit D20 output from second memory block 11 in a primary comparison. Similarly, bits D11, D12, and D13 output from first memory block 10 are respectively compared with bits D21, D22, and D23 output from second memory block in primary comparisons. Likewise, bits D30, D31, D32, and D33 output from third memory blocks 12 are respectively compared with bits D40, D41, D42, and D43 output from fourth memory block 13 in primary comparisons. In other words, two bits output from different respective memory blocks are compared with each other in primary comparisons, and results of the primary comparisons are combined pair wise to generate output data through corresponding data 10 pins DQ0 through DQ3.

Figure 3A:
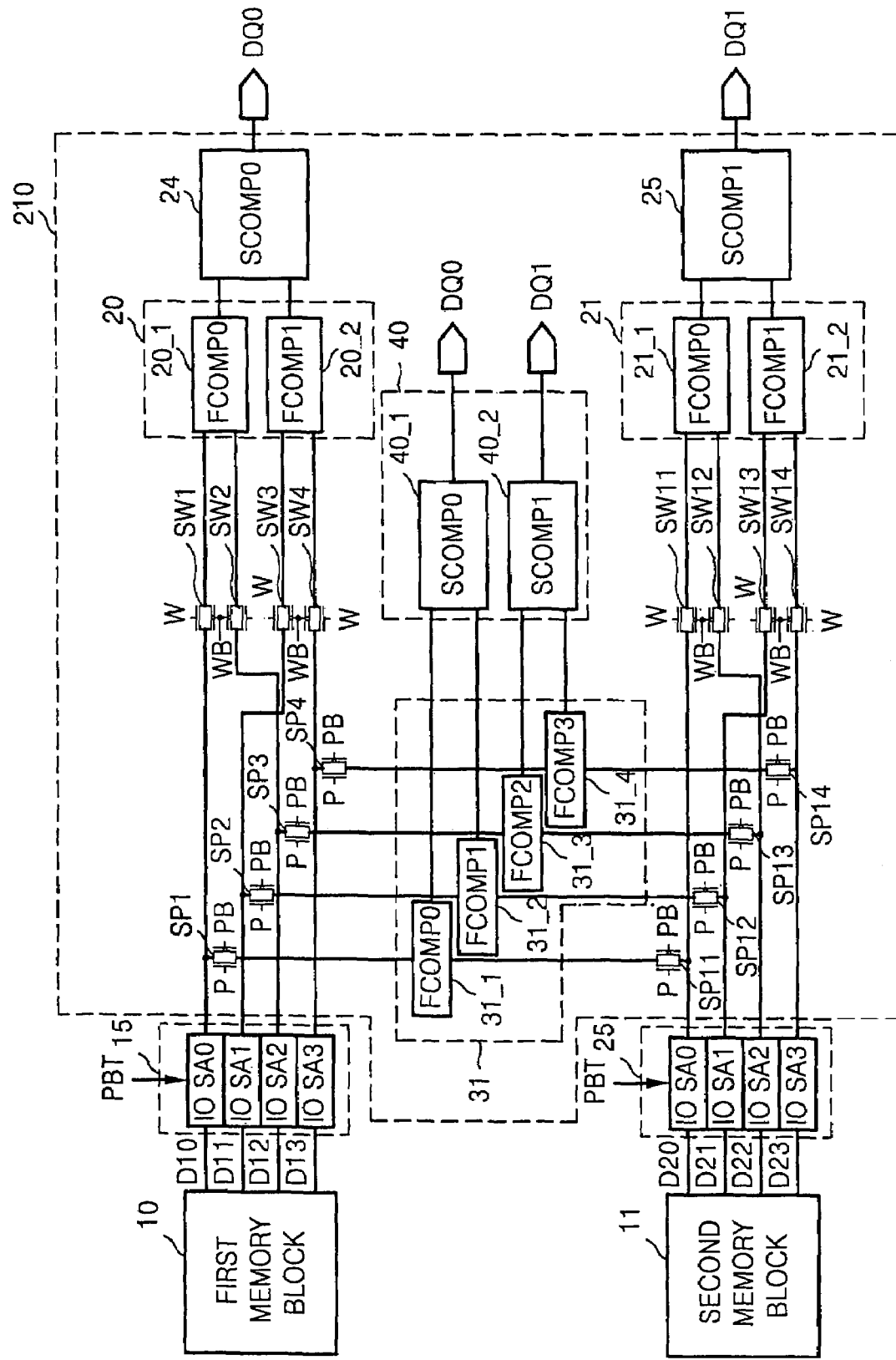
FIGS. 3A and 3B illustrate a semiconductor memory device including a parallel bit test circuit according to an embodiment of the present invention.
Figure 3B:
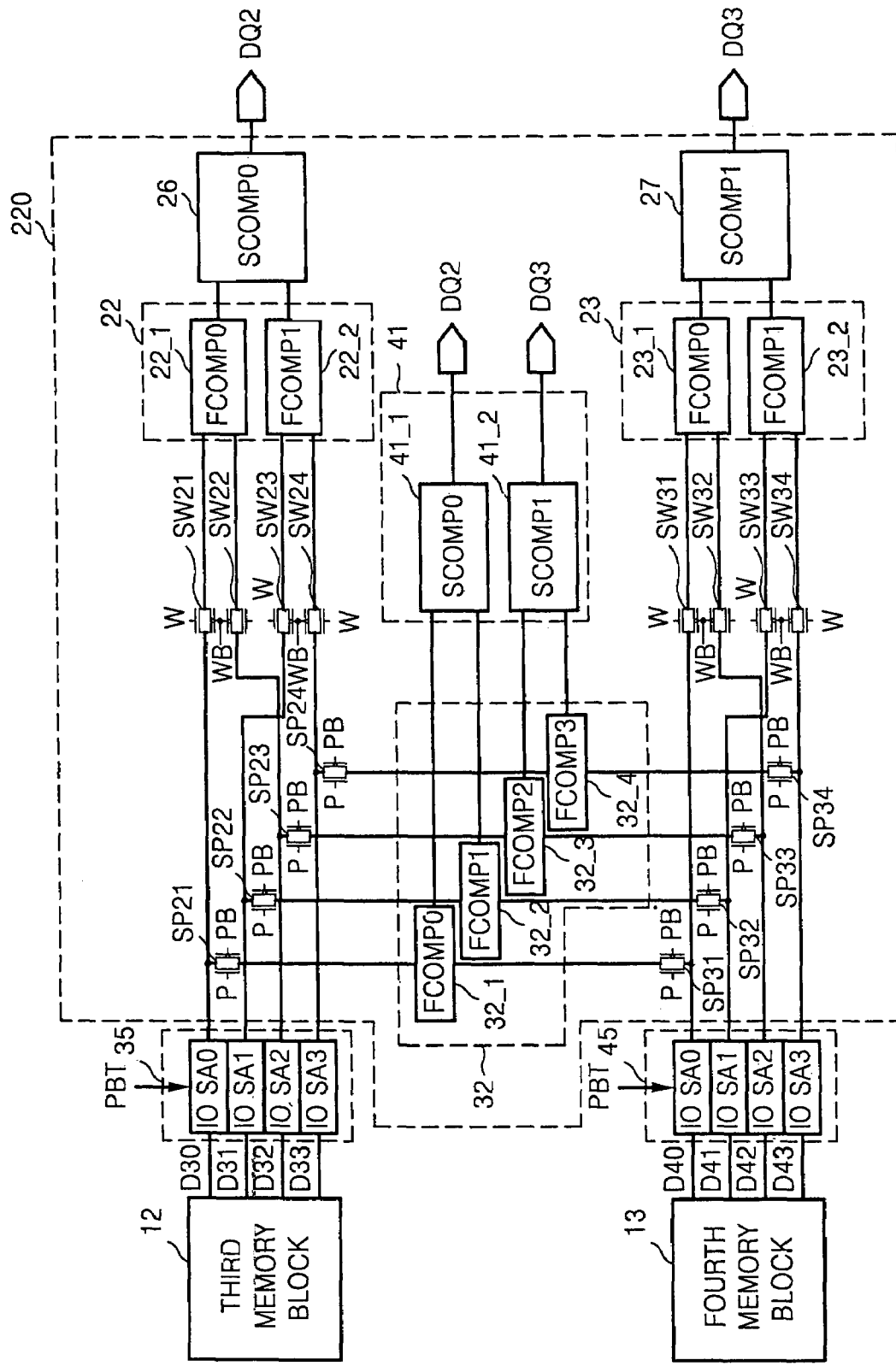

FIGS. 3A and 3B are block diagrams illustrating a semiconductor memory device including a parallel bit test circuit according to an embodiment of the present invention. Referring to FIGS. 3A and 3B, the semiconductor memory device comprises first through fourth memory blocks 10, 11, 12, and 13, a plurality of sense amplifiers 15, 25, 35, and 45 corresponding to first through fourth memory blocks 10, 11, 12, and 13, respectively, and parallel bit test circuits 210 and 220.

Each of memory blocks 10, 11, 12, and 13 comprises four IO lines adapted to input and output four (4) bits of data in parallel. Typically, each memory block inputs or outputs four bits while a column select line (CSL) is activated in response to a column address. In other words, the four bits are usually accessed in parallel under the control of the same column select line. Each of memory blocks 10, 11, 12, and 13 has a predetermined memory capacity, e.g., 16 M, and may include a normal memory cell array and redundant array used for repair.

In general, the configuration of the semiconductor memory device could be modified to include fewer or more memory blocks and fewer or more IO lines with each memory block. Moreover, those skilled in the art will recognize a variety of additional ways in which the semiconductor memory device could be modified without departing from the scope of the invention.

Parallel bit test circuits 210 and 220 include a wafer test circuit and a package test circuit. The wafer test circuit includes a first comparison group comprising comparison blocks 20, 21, 22, and 23, a second comparison group comprising comparators 24, 25, 26, and 27, and a plurality of first mode switches SW1-SW4, SW11-SW14, SW21-SW24, and SW31-SW34. First mode switches SW1-SW4, SW11-SW14, SW21-SW24, and SW31-SW34 will be referred to collectively hereafter as first mode switches SW1 through SW34. The package test circuit includes a third comparison group including comparison blocks 31 and 32, a fourth comparison group comprising comparison blocks 40 and 41, and a plurality of second mode switches SP1-SP4, SP11-SP14, SP21-SP24, and SP31-SP34. Second mode switches SP1-SP4, SP11-SP14, SP21-SP24, and SP31-SP34 will be referred to collectively hereafter as second mode switches SP1 through SP34.

Memory blocks 10, 11, 12, and 13 each output four bits Di0, Di1, Di2, and Di3 (i∈{1, 2, 3, 4}), for the respective memory blocks. Each of memory blocks 10, 11, 12, and 13 outputs the corresponding four bits in parallel through four IO lines while a respective corresponding column address is activated. Data output from respective memory blocks 10, 11, 12, and 13 is sense-amplified by respective corresponding sense amplifiers 15, 25, 35, and 45 to produce sense-amplified data.

Sense amplifiers 15, 25, 35, and 45 provide the sense-amplified data to parallel bit test circuits 210 and 220 in response to a PBT signal. The PBT signal is activated in a PBT mode and is typically activated in response to a PBT command output from a test apparatus (not shown).

In a normal mode other than the PBT mode, sense amplifiers 15, 25, 35, and 45 output sense-amplified data through normal output paths. In other words, in the normal mode, sense-amplified data produced by sense amplifiers 15, 25, 35, and 45 is output without passing through parallel bit test circuits 210 and 220.

Comparison blocks 20 through 23 in the first comparison group and comparators 24 through 27 in the second comparison group are used in first test mode Mode1 and comparison blocks 31 and 32 in the third comparison group and comparison blocks 40 and 41 in the fourth comparison group are used in second test mode Mode2.

Comparison blocks 20 through 23 in the first comparison group and comparison blocks 31 and 32 in the third comparison group each typically comprise an exclusive OR (XOR) gate used as a comparator and comparators 24 through 27 in the second comparison group and comparison blocks 40 and 41 in the fourth comparison group each typically comprise an OR gate used as a comparator. However, those skilled in the art will recognize that other types of comparators may be used.

First mode switches SW1 through SW34 are turned on in response to a first test mode signal (i.e., a wafer test signal) W to provide output data from corresponding sense amplifiers 15, 25, 35, and 45 to respective comparison blocks 20 through 23 in the first comparison group. First test mode signal W is activated in first test mode Mode1. Reference character WB denotes an inverted signal of first test mode signal W.

Each of comparison blocks 20 through 23 in the first comparison group includes a corresponding pair of comparators $2i\_1$ and $2i\_2$, (i∈{0, 1, 2, 3}). Comparators $2i\_1$ and $2i\_2$ each receive two bits of data from the same memory block. The same operations are used to test each of memory blocks 10, 11, 12, and 13, and therefore operations used to test first memory block 10 will be explained as a representative example.

For instance, comparator 20_1 performs an XOR operation on bits D10 and D12 output from first memory block 10 and comparator 20_2 performs an XOR operation on bits D11 and D13. Results of the XOR operations performed by comparators 20_1 and 20_2 are output to comparator 24 in the second comparison group. Comparator 24 then performs an OR operation on the results of the XOR operations. A result of the OR operation performed by comparator 24 is then output on IO pin DQ0.

Second mode switches SP1 through SP34 are turned on in response to a second test mode signal (i.e., a package test signal) P to provide output data from corresponding sense amplifiers 15, 25, 35, and 45 to respective comparison blocks 31 and 32 in the third comparison group. Second test mode signal P is activated in second test mode Mode2. A reference character PB denotes an inverted signal of second test mode signal P.

Each of comparison blocks 31 through 32 in the third comparison group includes comparators $3i\_j$ (i∈{1, 2} and j∈{1, 2, 3, 4}). Each comparator $3i\_j$ receives as input two bits of data from adjacent memory blocks. For example, comparator 31_1 receives one input from memory block 10 and one input from memory block 11.

The operation of the semiconductor memory device in the second test mode will be described in further detail below with reference to first and second memory blocks 10 and 11. The operation of third and fourth memory blocks 12 and 13 in the second test mode is similar to the operation of first and second memory blocks 10 and 11.

Referring to FIG. 3A, comparator 31_1 performs an XOR operation on bit D10 output from first memory block 10 and bit D20 output from second memory block 11 and produces an output signal. Comparator 31_2 performs an XOR operation on bit D11 output from first memory block 10 and bit D21 output from second memory block 11 and produces an output signal. Similarly, each of comparators 31_3 and 31_4 performs an XOR operation on a bit from first memory block 10 and a corresponding bit from second memory block 11 and outputs an output signal.

Each of comparators 40_1, 40_2, 41_1, and 41_2 in the fourth comparison group receives a pair of input signals from a pair of corresponding comparators in comparison block 31 or 32 and performs an OR operation the pair of input signals to produce an output signal on a corresponding IO pin DQi (i∈{1, 2, 3, 4}). The output signals on IO pins DQ0 through DQ3 are output to the test apparatus and are used to detect defective cells in the semiconductor memory device.

FIG. 4 is a conceptual diagram of a parallel bit test circuit according to an embodiment of the present invention. The parallel bit test circuit illustrated in FIG. 4 is used to test two memory blocks.

Referring to FIG. 4, the parallel bit test circuit comprises a selection circuit 410, a primary comparison unit 420, and first and second secondary comparators 431 and 432. Selection circuit 410 comprises first through fourth selectors 411, 412, 413, and 414. Primary comparison unit 420 comprises first through fourth primary comparators 421, 422, 423, and 424. Each of primary comparators 421, 422, 423, and 424 typically comprises an XOR gate and each of secondary comparators 431 and 432 typically comprises an OR gate. Each of selectors 411, 412, 413, and 414 typically comprises a multiplexer.

Selection circuit 410 receives bits SD10, SD11, SD12, and SD13 and bits SD20, SD21, SD22, and SD23, which have been output from the two memory blocks and sense-amplified by sense amplifiers, and provides the received bits to primary comparison unit 420 in response to first test mode signal W or second test mode signal P. Bits SD10, SD11, SD12, and SD13 may be provided, for example, from sense amplifier 15 in FIG. 3A by sensing and amplifying bits D10, D11, D12, and D13 output from first memory block 10. Bits SD20, SD21, SD22, and SD23 may be output, for example, from sense amplifier 25 in FIG. 3A by sensing and amplifying bits D20, D21, D22, and D23 output from second memory block 11.

The operation of the parallel bit test circuit illustrated in FIG. 4 is explained in further detail below.

First selector 411 receives two bits SD12 and SD20 and selectively provides one among bits SD12 and SD20 to first primary comparator 421 according to a test mode. More particularly, first selector 411 provides bit SD12 to first primary comparator 421 where first test mode signal W is activated and provides bit SD20 to first primary comparator 421 where second test mode signal P is activated. Accordingly, in first test mode Mode1, first primary comparator 421 compares bits SD10 and SD12, which are output from the same memory block, and in second test mode Mode2, first primary comparator 421 compares bits SD10 and SD20, which are respectively output from different memory blocks.

Second selector 412 receives bits SD13 and SD21 and selectively provides one among bits SD13 and SD21 to second primary comparator 422 based on the test mode. Accordingly, in first test mode Mode1, second primary comparator 422 compares bits SD11 and SD13, which are output from the same memory block, and in second test mode Mode2, second primary comparator 422 compares bits SD11 and SD21, which are respectively output from different memory blocks.

Similarly, each third and fourth selectors 413 and 414 receive two bits SD10 and SD22 and SD11 and SD23, respectively and selectively output one among the two bits to corresponding third and fourth primary comparators 423 or 424 based on the test mode. Accordingly, in first test mode Mode1, third and fourth primary comparators 423 and 424 each compare two bits output from the same memory block, and in second test mode Mode2, third and fourth primary comparators 423 and 424 each compare two bits respectively output from different memory blocks.

First secondary comparator 431 performs an OR operation on output signals from primary comparators 421 and 422 and outputs a result of the OR operation on IO data pin DQ0. Similarly, second secondary comparator 432 performs an OR operation on output signals from primary comparators 423 and 424 and outputs a result of the OR operation on IO data pin DQ1.

A parallel bit test circuit for data output from third and fourth memory blocks 12 and 13 may be implemented in a similar manner as the parallel bit test circuit illustrated in FIG. 4 for data output from first and second memory blocks 10 and 11.

Figure 5:
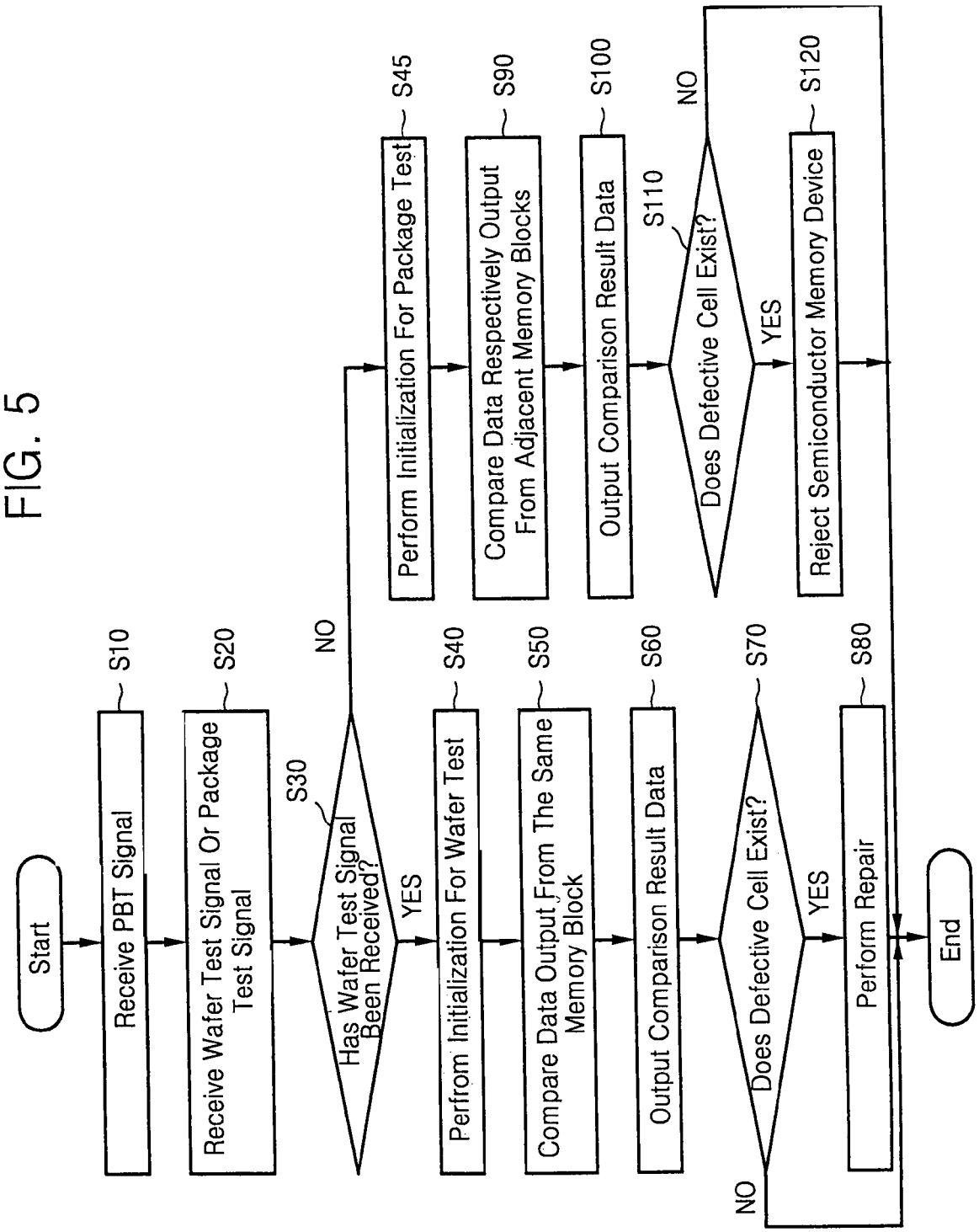
FIG. 5 is a flowchart illustrating a parallel bit test method according to an embodiment of the present invention.

FIG. 5 is a flowchart illustrating a parallel bit test method according to an embodiment of the present invention. The parallel bit test method illustrated in FIG. 5 is typically performed by a semiconductor memory device including a PBT circuit according to an embodiment of the present invention.

Referring to FIG. 5, a test apparatus generates a command to set a PBT mode in a semiconductor memory device. The semiconductor memory device receives the command and activates a PBT signal in response to the command to place the semiconductor memory device in a PBT test mode. The PBT test circuit receives the PBT signal in an operation S10. Next, in an operation S20, the PBT circuit receives wafer test signal W or package test signal P.

In some embodiments of the invention, wafer test signal W or package test signal P may be provided from a source external to the semiconductor device. In other embodiments, wafer test signal W or package test signal P may be generated within the semiconductor memory device in response to a command to establish a wafer test mode or a package test mode.

Next, an operation S30 determines whether the signal received (or internally generated) in operation S20 is wafer test signal W or package test signal P. Where operation S30 determines that the signal is wafer test signal W, initialization for a wafer test is performed in an operation S40. Alternatively, where operation S30 determines that the signal is package test signal P, initialization for a package test is performed in an operation S45. During initialization for the package test or the wafer test, the semiconductor memory device receives test pattern data from the test apparatus and stores the test pattern data in memory blocks.

In the wafer test mode, the semiconductor memory device reads data from each memory block in response to a read command from the test apparatus and performs comparisons between pairs of bits in the same memory block in primary comparisons. These comparisons between pairs of bits in the same memory block are performed in an operation S50. Next, in an operation S60, the semiconductor memory device combines results of the primary comparisons in secondary comparisons to generate comparison results and outputs the comparison results to the test apparatus through corresponding IO pins DQ. Then, in an operation S70, the test apparatus examines the comparison results to detect the presence of defective memory cells in the semiconductor memory device. More particularly, a CSL corresponding to a memory cell array including a defective cell can be identified. Where operation S70 detects the presence of one or more defective memory cells, an operation S80 is performed to replace the memory cell array corresponding to the identified CSL with a redundant memory cell array. On the other hand, where operation S70 does not detect the presence of any defective memory cells, the parallel bit test method terminates.

In the package test mode, the semiconductor memory device reads data from each memory block in response to a read command from the test apparatus and performs comparisons between pairs of bits in different (e.g., adjacent) memory blocks in primary comparisons. These comparisons between pairs of bits in different memory blocks are performed in an operation S90. Next, in an operation S100, the semiconductor memory device combines results of the primary comparisons in secondary comparisons to generate comparison results and outputs the comparison results to the test apparatus through corresponding IO pins DQ. Then, in an operation S110, the test apparatus examines the comparison results to detect the presence of defective memory cells in the semiconductor memory device.

It is difficult to repair defective cells after packaging the semiconductor memory device, and therefore the existence or non-existence of defective cells may be used to determine whether to accept or reject the semiconductor memory device. In other words, where operation S110 determines that the semiconductor memory device contains defective memory cells, the semiconductor memory device may be rejected in an operation S120. Otherwise, where operation S110 does not determine that the semiconductor memory device contains defective memory cells, the parallel bit test method terminates. In another embodiment of the present invention, where operation S110 determines that the semiconductor memory device contains defective memory cells, a memory controller may be prohibited from accessing a memory block containing the defective cells.

In the above-described embodiments of the present invention, it has been explained that a semiconductor memory device includes 4 ($2^2$) IO lines per memory block. However, the number of IO lines per memory block can vary. For example, $2^N$ (e.g., 8 or 16) IO lines may be provided for each memory block. In this case, output data may be compared through N-stages of comparison rather than simply through the primary and secondary comparisons.

According to selected embodiments of the invention, a PBT is divided into at least two modes, i.e., a wafer test mode and a package test mode. In the wafer test mode, bits output from the same memory block are compared with each other. In the package test mode, bits output from different memory blocks are compared with each other. Accordingly, the PBT performs tests with a more extensive set of test data patterns than conventional PBT methods. As a result, test coverage and test reliability are both improved.

The foregoing exemplary embodiments are teaching examples. Those of ordinary skill in the art will understand that various changes in form and details may be made to the exemplary embodiments without departing from the scope of the invention as defined by the claims.

What is claimed:

1. A parallel bit test circuit for a semiconductor memory device including a plurality of memory blocks, the parallel bit test circuit comprising:
    a plurality of primary comparators comprising:
        a first comparator group each adapted to receive and compare two bits of data output in parallel from a corresponding one of the plurality of memory blocks in a first test mode to produce primary comparison output data, and
        a second comparator group each adapted to receive and compare two bits of data output by two respectively different memory blocks among the plurality of memory blocks in a second test mode to produce primary comparison output data; and,
    a secondary comparator adapted to combine at least two bits of primary comparison output data produced by the first comparator group, or to combine at least two bits of primary comparison output data produced by the second comparator group to produce secondary comparison output data.

2. The parallel bit test circuit of claim 1, further comprising:
    a selection circuit adapted to receive data from the plurality of memory blocks and selectively provide two bits of data from one of the plurality of memory blocks to one comparator of the first comparator group, or two bits of data from respectively different ones of the plurality of memory blocks to one comparator of the second comparator group according to a logic state of a test mode signal.

3. The parallel bit test circuit of claim 2, wherein each of the plurality of memory blocks outputs N bits, wherein N is an integer greater than one;
    wherein in the first test mode, the selection circuit receives a pair of bits among the N bits output by one of the plurality of memory blocks and provides the pair of bits to a corresponding primary comparator among the first comparator group; and
    wherein in the second test mode, the selection circuit receives a first bit among the N bits output by one of the plurality of memory blocks and a second bit among the N bits output by another one of the plurality of memory blocks and provides the first and second bits to a corresponding primary comparator among the second comparator group.

4. The parallel bit test circuit of claim 2, wherein
    the selection circuit is further adapted to provide data output from the plurality of memory blocks to the first comparator group or the second comparator group according to the logic state of the test mode signal.

5. The parallel bit test circuit of claim 2, wherein the selection circuit comprises a plurality of selectors each adapted to receive a first bit output from a first memory block among the plurality of memory blocks and a second bit output from a second memory block among the plurality of memory blocks and further adapted to select one bit from among the received two bits and provide the selected one bit to a corresponding one among the plurality of primary comparators.

6. The parallel bit test circuit of claim 1, wherein each of the plurality of primary comparators comprises an exclusive OR gate and the secondary comparator comprises an OR gate.

7. The parallel bit test circuit of claim 1, wherein the first test mode occurs before the semiconductor memory device is packaged and the second test mode occurs after the semiconductor memory device is packaged.

8. The parallel bit test circuit of claim 1, wherein the first test mode occurs before the semiconductor memory device is repaired and the second test mode occurs after the semiconductor memory device is repaired.

9. A parallel bit test method for a semiconductor memory device including a plurality of memory blocks, the method comprising:
    writing test pattern data into the plurality of memory blocks;
    outputting two bits from each memory block in parallel and comparing the two bits output from each memory block with each other in a first test mode; and
    outputting two bits from respectively different memory blocks and comparing the two bits output from the respectively different memory blocks with each other in a second test mode.

10. The method of claim 9, wherein the two bits output from each memory block in parallel and the two bits output from respectively different memory blocks are compared by a plurality of comparators, and the method further comprises:
    selectively providing the two bits output from each memory block in parallel or the two bits output from respectively different memory blocks to the plurality of comparators based on a logic state of a test mode signal.

11. The method of claim 10, wherein each of the plurality of memory blocks outputs N bits, where N is an integer greater than 1, and wherein selectively providing the two bits output from each memory block in parallel or the two bits output from respectively different memory blocks to the plurality of comparators comprises:
    dividing the N bits of parallel data output from each memory block into pairs and providing each pair of bits to a corresponding one among the plurality of comparators in the first test mode; and,
    in the second mode, providing a pair of bits comprising a first bit selected from among the N bits of data output from a first memory block among the plurality of memory blocks and a second bit selected from among N bits of parallel data output from a second memory block to a corresponding one among the plurality of comparators.

12. A semiconductor memory device, comprising:
    a plurality of memory blocks;
    a plurality of primary comparators each adapted to receive and compare two bits of data output in parallel from each memory block in a first test mode and further adapted to receive and compare two bits of data output from respectively different memory blocks in a second test mode; and,
    a secondary comparator adapted to generate test result data by combining at least two signals among signals output from the respective plurality of primary comparators.

13. The semiconductor memory device of claim 12, further comprising:
    a selection circuit adapted to receive data from the plurality of memory blocks and selectively provide two bits of data output from each memory block or two bits of data output from different memory blocks to a corresponding one among the plurality of primary comparators based on a logic state of a test mode signal.

14. The semiconductor memory device of claim 12, wherein at least one among the plurality of memory blocks comprises a redundant memory cell array adapted to replace a memory cell array within the memory blocks based on test result data generated in the first test mode.

* * * * *